United States Patent
Chung et al.

(10) Patent No.: US 7,667,693 B2
(45) Date of Patent: *Feb. 23, 2010

(54) TOUCH SENSING APPARATUS USING VARYING SIGNAL DELAY INPUT TO A FLIP-FLOP

(75) Inventors: Shin-Hong Chung, Guangdong (CN); Han-Che Wang, Guangdong (CN); Kuan-Hong Hsieh, Guangdong (CN)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 560 days.

This patent is subject to a terminal disclaimer.

(21) Appl. No.: 11/558,421

(22) Filed: Nov. 9, 2006

(65) Prior Publication Data
US 2007/0108994 A1    May 17, 2007

(30) Foreign Application Priority Data
Nov. 11, 2005   (TW) .............................. 94139690 A

(51) Int. Cl.
*G06F 3/041* (2006.01)

(52) U.S. Cl. ................. 345/173; 178/18.01; 178/18.02; 200/600; 324/415

(58) Field of Classification Search ................. 345/173; 178/18.01, 18.02–18.04, 18.05, 18.06, 18.07, 178/20.04; 324/663, 415; 200/600
See application file for complete search history.

(56) References Cited

U.S. PATENT DOCUMENTS

| | | | | |
|---|---|---|---|---|
| 4,081,700 | A * | 3/1978 | Hamilton, II | 307/116 |
| 4,331,890 | A * | 5/1982 | Makino et al. | 307/326 |
| 5,495,077 | A | 2/1996 | Miller | |
| 5,790,107 | A * | 8/1998 | Kasser et al. | 345/174 |
| 5,943,516 | A * | 8/1999 | Uchiyama et al. | 396/281 |
| 6,534,970 | B1 | 3/2003 | Ely | |
| 6,545,614 | B1 | 4/2003 | Kasai | |
| 6,885,365 | B1 * | 4/2005 | Kang | 345/173 |
| 2006/0007181 | A1 * | 1/2006 | Jung et al. | 345/173 |

* cited by examiner

*Primary Examiner*—Amare Mengista
*Assistant Examiner*—Gene W Lee
(74) *Attorney, Agent, or Firm*—Winston Hsu

(57) ABSTRACT

A touch sensing apparatus is provided. The apparatus includes: a flip-flop, a sensor, an AC signal and a detector. The AC signal supplies AC signals to the flip-flop. The flip-flop outputs a first type output signal at the output thereof when the sensor is not touched. The sensor receives electricity signals from an object, and causes a delay of the AC signal to be inputted to the first input of the flip-flop, the delay of the AC signal to be inputted to the first input of the flip-flop further causes the flip-flop to output a second type output signal at the output thereof. The detector detects a change from the first type output signal to the second type output signal at the output of the flip-flop and accordingly identifies a touch on the sensor.

9 Claims, 8 Drawing Sheets

TOUCH SENSING APPARATUS USING VARYING SIGNAL DELAY INPUT TO A FLIP-FLOP

BACKGROUND OF THE INVENTION

1. Field of the Invention

The present invention relates generally to touch sensing apparatuses, and particularly to a touch sensing apparatus for sensing electricity signals of an object.

2. Description of Related Art

There are several available types of touch-sensing apparatuses that may be employed for use as positional indicators in apparatus such as personal computers. Among them, resistive-membrane positioning sensors and capacitive positioning sensors are well known and typically used in several applications. However, the resistive-membrane positioning sensors generally have poor resolutions. In addition, surfaces of the resistive-membrane positioning sensors are often exposed in air, and therefore are easily worn out. Furthermore, resistive-membrane positioning sensors are relatively expensive.

A capacitive positioning sensor typically includes a substrate which supports a first and second interleaved, closely spaced, non-overlapping arrays of conductive plates. An insulating layer overlies the first and second arrays. When an outer surface of the insulating layer is touched, the capacitances of at least one of the columns of plates of the first array and one of the rows of plates of the second array underlying the insulating layer at a location being touched changes with respect to ambient ground. Based upon the measured capacitance of each column of the first array and row of the second array, a microcomputer produces output signals representing the coordinates of the location being touched. These output signals can be used, for example, to control a position of a cursor on a display screen of a personal computer or to make a selected function command. Although the capacitive positioning sensor has been designed to avoid being exposed in air and thereby to avoid being easily worn out, however, by overlying the insulating layer thereon, the sensitivity of the touch sensing apparatus is reduced.

What is still needed is a touch sensing apparatus with reduced circuitry complexity, improved sense sensitivity, improved efficiency, and lower manufacturing costs.

SUMMARY OF THE INVENTION

A touch sensing apparatus is provided. A preferred embodiment of a touch sensing apparatus includes a flip-flop, an alternating current (AC) signal source, a sensor, an integration circuit, and a resistor. The flip-flop has a first input, a second input, and an output and is configured for outputting a first type output signal at the output thereof when the sensor is not touched. The alternating current (AC) signal source is for supplying AC signals to the first input and the second input of the flip-flop. The sensor is connected to the first input of the flip-flop and is configured for receiving electricity signals from the object, and causing a delay of the AC signal to be inputted to the first input of the flip-flop, the delay of the AC signal to be inputted to the first input of the flip-flop further causing the flip-flop to output a second type output signal at the output thereof. The integration circuit is interposed between the second input of the flip-flop and the AC signal source and is for delaying the AC signal to be inputted to the second input of the flip-flop. The resistor is interposed between AC signal source and the first input of the flip-flop. The detector is electrically connected to the output of the flip-flop and is for detecting a change from the first type output signal to the second type output signal at the output of the flip-flop and accordingly identifies a touch on the sensor.

Other advantages and novel features will be drawn from the following detailed description of the preferred embodiment with reference to the attached drawings, in which:

DETAILED DESCRIPTION OF THE INVENTION

Figure 1:
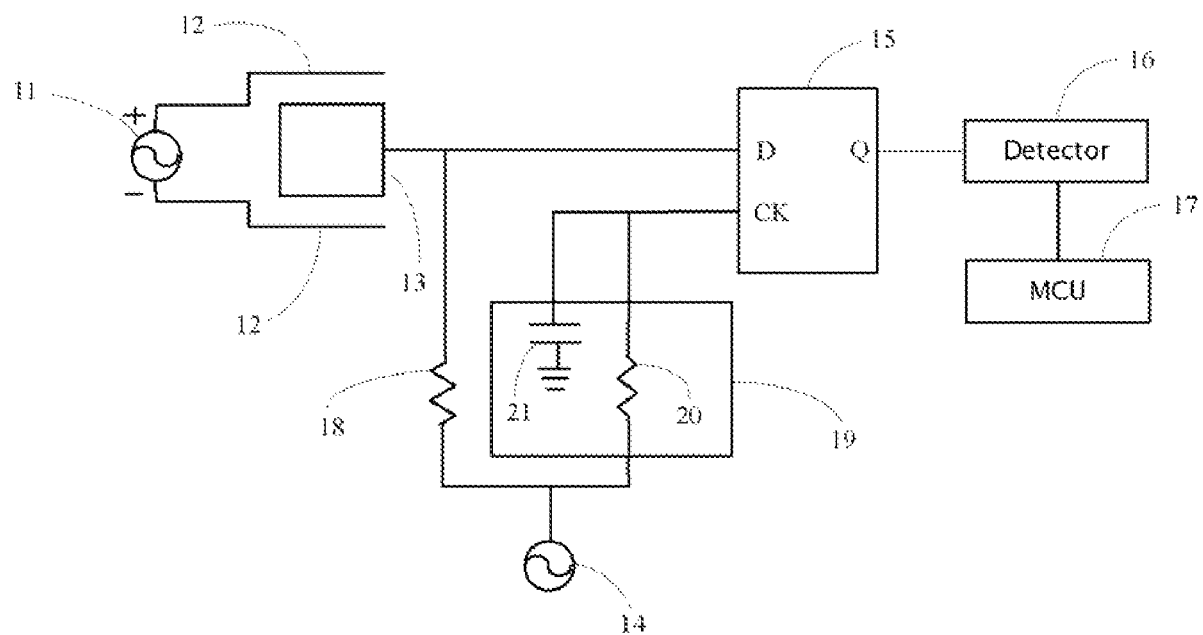
FIG. 1 is an exemplary circuit diagram of a touch sensing apparatus in accordance with a first preferred embodiment of the present invention.

FIG. 1 is an exemplary circuit diagram of a touch sensing apparatus in accordance with a first preferred embodiment of the present invention. The apparatus mainly includes a differential signal source 11, two conductors 12, a sensor 13, an alternating current (AC) signal source 14, a D-type flip-flop 15, a detector 16, a microcontroller unit (MCU) 17, a first resistor 18, and a first integration circuit 19.

The D-type flip-flop 15 includes a data signal input D (hereinafter "the input D"), a clock signal input CK (hereinafter "the input CK"), and an output Q. The differential signal source 11 has a positive output and a negative output, each connecting to the conductors 12 correspondingly. The sensor 13 is located between the conductors 12, and forms two parallel-arranged capacitors with the conductors 12. The sensor 13 is electrically connected to the input D of the D-type flip-flop 15.

The differential signal source 11 outputs a positive signal and a negative signal via the positive output (labeled as "+") and the negative output (labeled as "−") thereof respectively. Generally, environmental noises can be generated in an environment with charged bodies such as electric lights and computers. The environmental noises are AC signals having irregular waveforms. When the environmental noises reach the parallel-arranged capacitors, positive half-waves and negative half-waves of the environmental noises are offset respectively by the positive signal and the negative signal outputted by the differential signal source 11. The touch sensing apparatus is therefore being protected from being affected by the environmental noises and improves a sensitivity thereof.

The AC signal source is connected and applies AC signals simultaneously to the first integration circuit 19 and the first resistor 18. The first integration circuit 19 is further connected to the input CK of the D-type flip-flop 15, and delays an active transition time between a high level (hereinafter simplified as "H") and a low level (hereinafter simplified as "L") of the AC signals to be inputted to the input CK, i.e., the first integration circuit 19 prolongs the active transition time of the AC signals to be inputted to the input CK. To clarify, the AC signals delivered by the first integration circuit 19 to the input CK is hereinafter referred to as the CK signals. The first resistor 18 is also connected to the input D of the D-type flip-flop 15, and constitutes a second integration circuit with the sensor 13. The second integration circuit prolongs the active transition time between H and L of the AC signals to be inputted to the input D, i.e., the second integration circuit prolongs the active transition time of the AC signals to be inputted to the input D. To clarify, the AC signals delivered by the second integration circuit to the input D is hereinafter referred to as the D signals.

The first integration circuit 19 is comprised of a second resistor 20 and a capacitor 21. Specifically, the second resistor 20 is interposed between the AC signal source 14 and the input CK of the D-type flip-flop 15, while the capacitor 21 is interposed between the ground and the input CK. However, more broadly, according to a principle of the present invention, the components of the first integration circuit 19 and the resistor 18 are chosen and arranged to achieve a goal which is: when the sensor 13 is not touched, the active transition time of the CK signals is delayed for a time longer than (or equal to) that of the D signal being delayed, thus resulting in a first type output signal at the output Q of the D-type flip-flop 15.

Generally, charged bodies generates alternating magnetic fields. When an electrical conducting object such as a human body moves into such an alternating magnetic field, inductive charges are generated and distributed on surfaces of the electrical conducting object, thus, improving electricity signals of the electrical conducting object. In the preferred embodiment, the differential signal source 11 provides such an alternating magnetic field improving the electricity signals of the electrical conducting object that touches the sensor 13.

The sensor 13 and the ground form a distributed capacitor. When the electrical conducting object touches the sensor 13, the inductive charges on the electrical conducting object flows to the sensor 13, thus causing a capacitance change of the distributed capacitor, further causing a capacitance change of the second integration circuit. The second integration circuit accordingly delays the active transition time of the D signals longer than the delay of the CK signals, thus resulting in a second type output signal at the output Q of the D-type flip-flop 15. That is, the D-type flip-flop 15 is triggered to change state. The detector 16 detects the state change of the D-type flip-flop 15, accordingly identifies a touch on the sensor 13 and then generates a notice signal to the MCU 17 to perform a predetermined operation.

Figure 2:
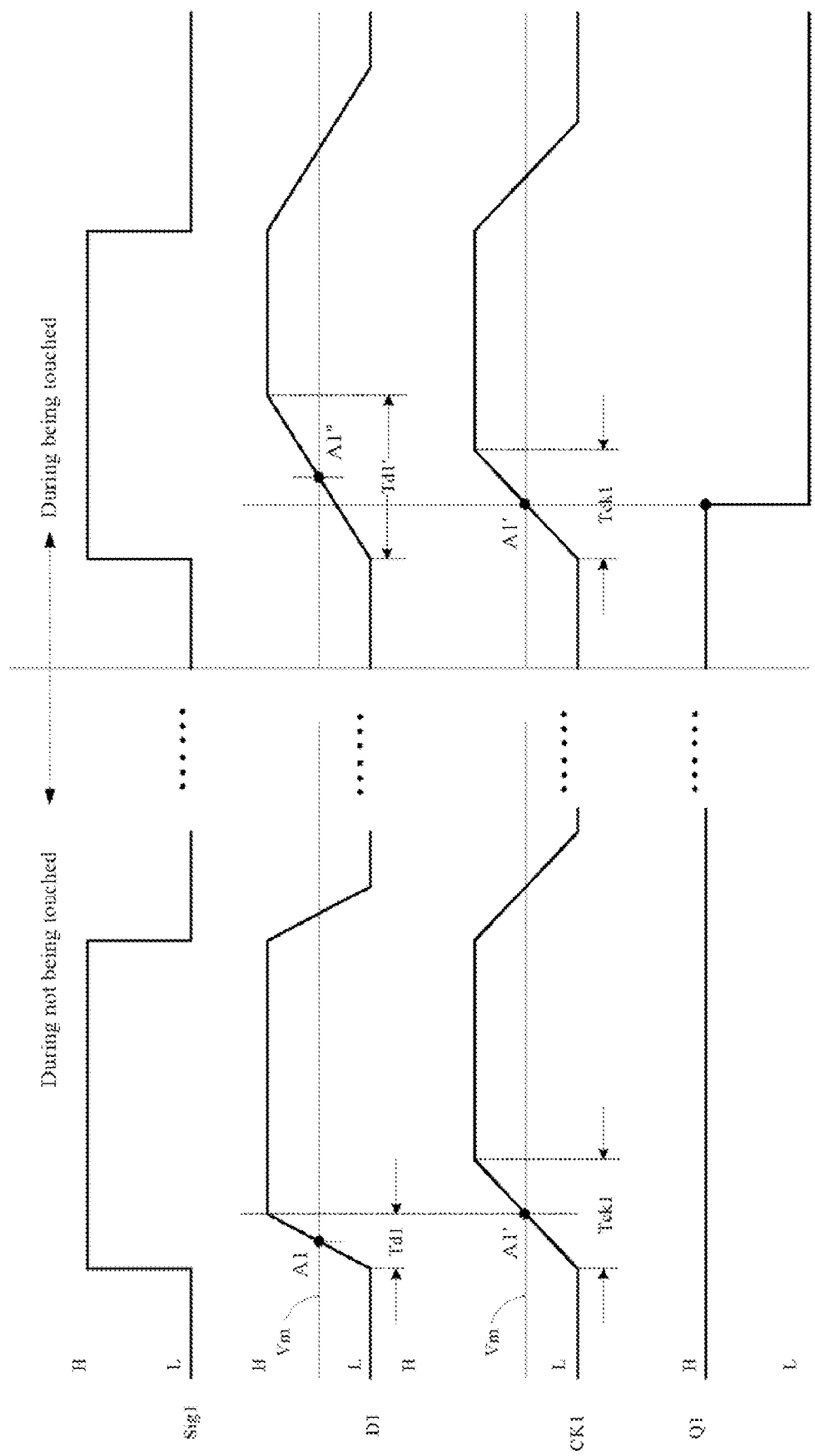
FIG. 2 is a waveform diagram of the input and output signals of the D-type flip-flop 15 when the sensor 13 is touched/not touched correspondingly by the electrical conducting object according to the FIG. 1.

FIG. 2 is a waveform diagram of the input and output signals of the D-type flip-flop 15 when the sensor 13 is touched/not touched correspondingly by the electrical conducting object according to the FIG. 1. For brevity, FIG. 2 shows the D-type flip-flop 15 is triggered by a positive-going transition (PGT) of the CK signals. However, persons skilled in the art will recognize that triggering the D-type flip-flop 15 by a negative-going transition (NGT) of the CK signals is also feasible.

In FIG. 2, waveform sig1 represents the AC signals generated by the AC signal source 14, waveform D1 represents the D signals, and waveform CK1 represents the CK signal. Line Vm represents a threshold voltage value and intersects with the Waveforms D1 and CK1 on a rising edge thereof, thus defining intersecting points A1 and A1'. In the preferred embodiment, intersecting point A1 is a transition point when the D signals change from L to H, and the intersected point A1' is an active trigger point of the D-type flip-flop 15 when the D-type flip-flop 15 is triggered. Td1 and Tck1 indicate the PGT times of the D signals and the CK signals respectively when the sensor 13 is not touched. Td1 is shorter than Tck1 and accordingly, the intersecting point A1 comes before the intersecting point A'. The D-type flip-flop 15 is triggered to output an H signal as indicated by waveform Q1 at the intersecting point A1'.

When the sensor 13 is touched by the electrical conducting object, the active transition time of the D signals is prolonged to Td1' and longer than Tck1. An intersecting point A1" which is defined by the Line Vm intersecting with the Waveforms D1 and represents a transition point of the D signals when the sensor is touched accordingly comes after the intersecting point A1' in timing. As a result, at the intersecting point A1, the D-type flip-flop 15 is triggered to output an L signal indicated in waveform Q1.

Figure 3:
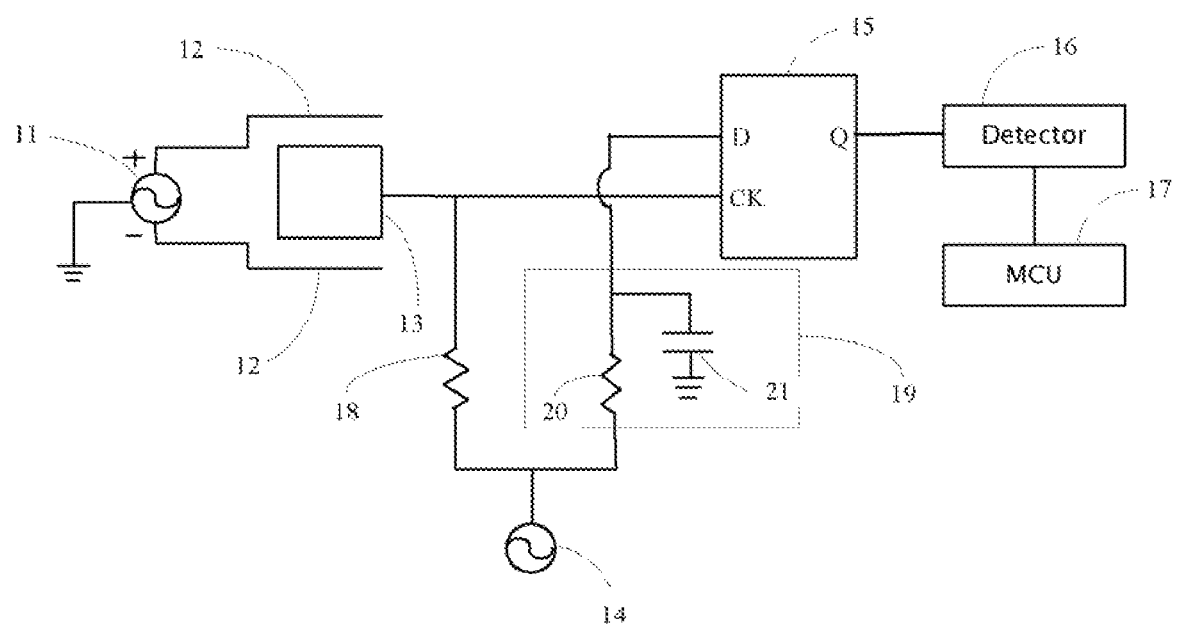
FIG. 3 is an exemplary circuit diagram of a touch sensing apparatus in accordance with a second preferred embodiment of the present invention.

FIG. 3 is an exemplary circuit diagram of the touch sensing apparatus in accordance with a second preferred embodiment of the present invention. As compared with FIG. 1, in this embodiment, the first integration circuit 19 is connected to the input D of the D-type flip-flop 15, and the second integration circuit is connected to the input CK of the D-type flip-flop 15. The first integration circuit 19 delays the D signal to be inputted to the input D and the second integration circuit delays the CK signals to be inputted to the input CK.

Figure 4:
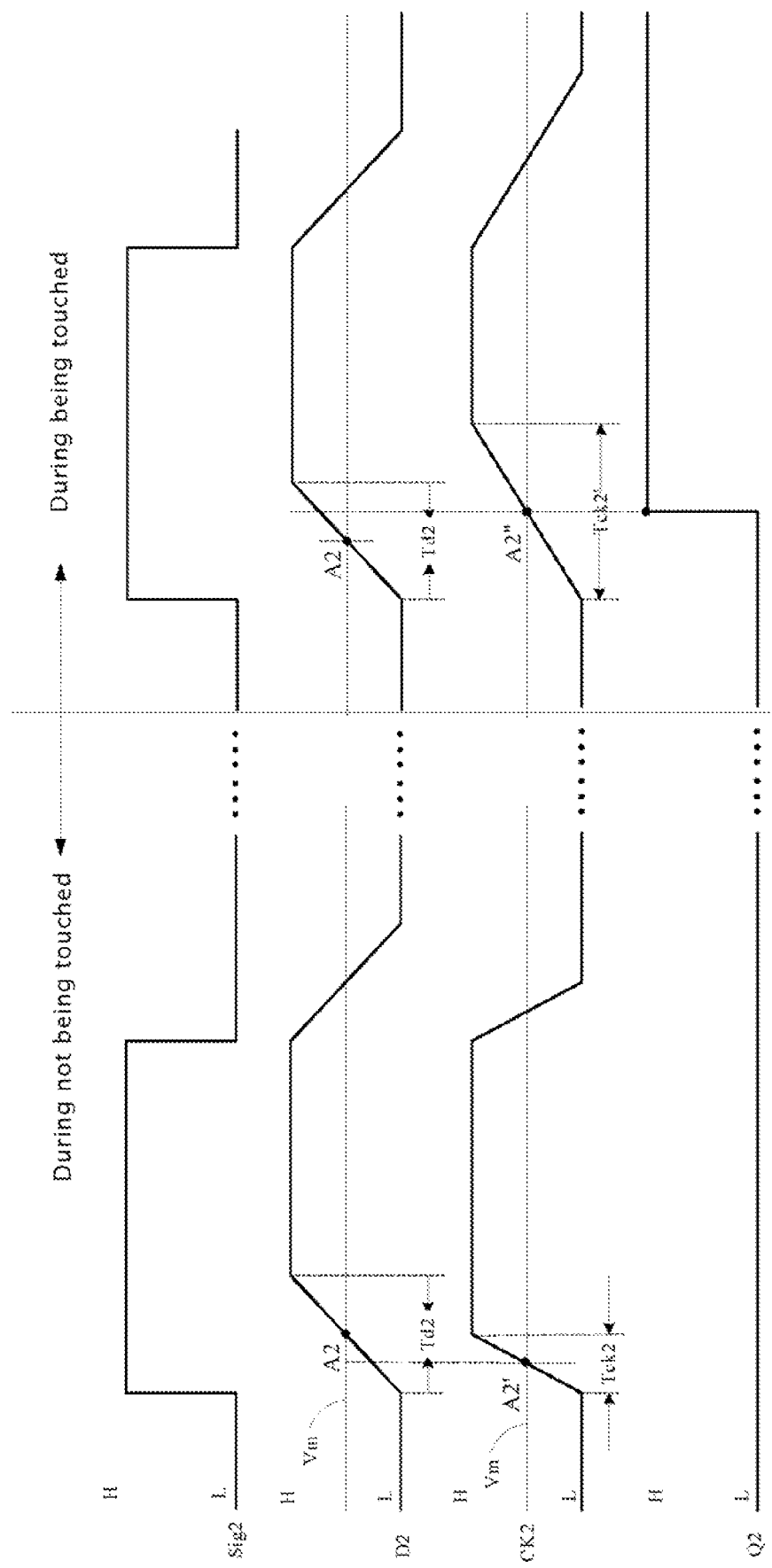
FIG. 4 is an waveform diagram of the input and output signals of the D-type flip-flop 15 when the sensor 13 is touched/not touched correspondingly by the electrical conducting object according to the FIG. 3.

FIG. 4 is a waveform diagram of the input and output signals of the D-type flip-flop 15 when the sensor 13 is touched/not touched correspondingly by the electrical conducting object according to the FIG. 3. Waveform sig2 represents the AC signals generated by the AC signal source 14, waveform D2 represents the D signal, and waveform CK2 represents the CK signal. Intersecting points A2 and A2' defined by the line Vm intersecting with the Waveforms D2 and CK2 respectively represent the transition point and the active trigger point of the D-type flip-flop 15. Td2 and Tck2 respectively indicate the PGT time of the D signals and the CK signals when the sensor 13 is not touched. In this embodiment, Td2 is longer than Tck2 and therefore, the intersecting point A2 is reached later in timing than the intersecting point A2'. As a result, at the intersecting point A2', the D-type flip-flop 15 is triggered to output an L signal indicated in waveform Q2.

When the sensor 13 is touched by the electrical conducting object, the active transition time of the CK signals is prolonged to Tck2' and longer than Td2. An intersecting point A2" represents the active trigger point of the CK signals when the sensor is touched and comes after the intersecting point A2 in timing. As a result, at the intersecting point A2", the D-type flip-flop 15 is triggered to output an H signal indicated by waveform Q2.

Figure 5:
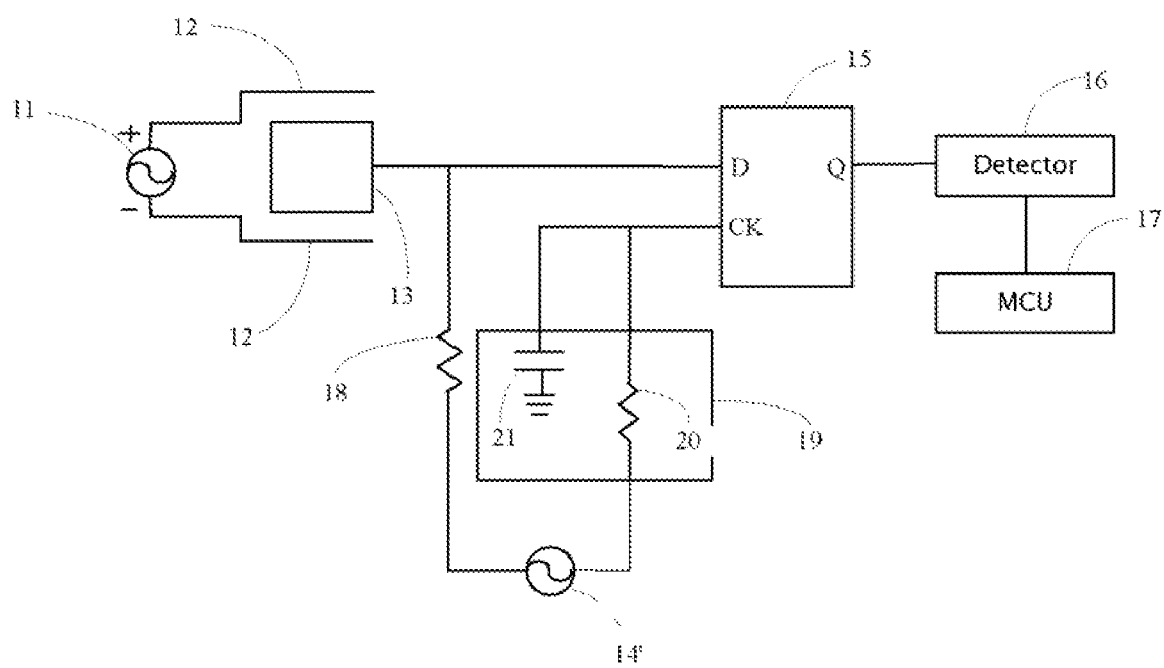
FIG. 5 is an exemplary circuit diagram of a touch sensing apparatus in accordance with a third preferred embodiment of the present invention.

FIG. 5 is an exemplary circuit diagram of the touch sensing apparatus in accordance with a third preferred embodiment of the present invention. In this embodiment, the AC signal source is embodied as a differential AC signal source 14'. The differential AC signal source 14' includes two outputs, of which one is connected to the first integration circuit 19 and another is connected to the second integration circuit. The differential AC signal source 14' produces a pair of differential AC signals simultaneously. The pair of differential AC signals are respectively transmitted to the first integration circuit 19 and the second integration circuit, and employed respectively as the CK signal and the D signal of the D-type flip-flop 15.

Figure 6:
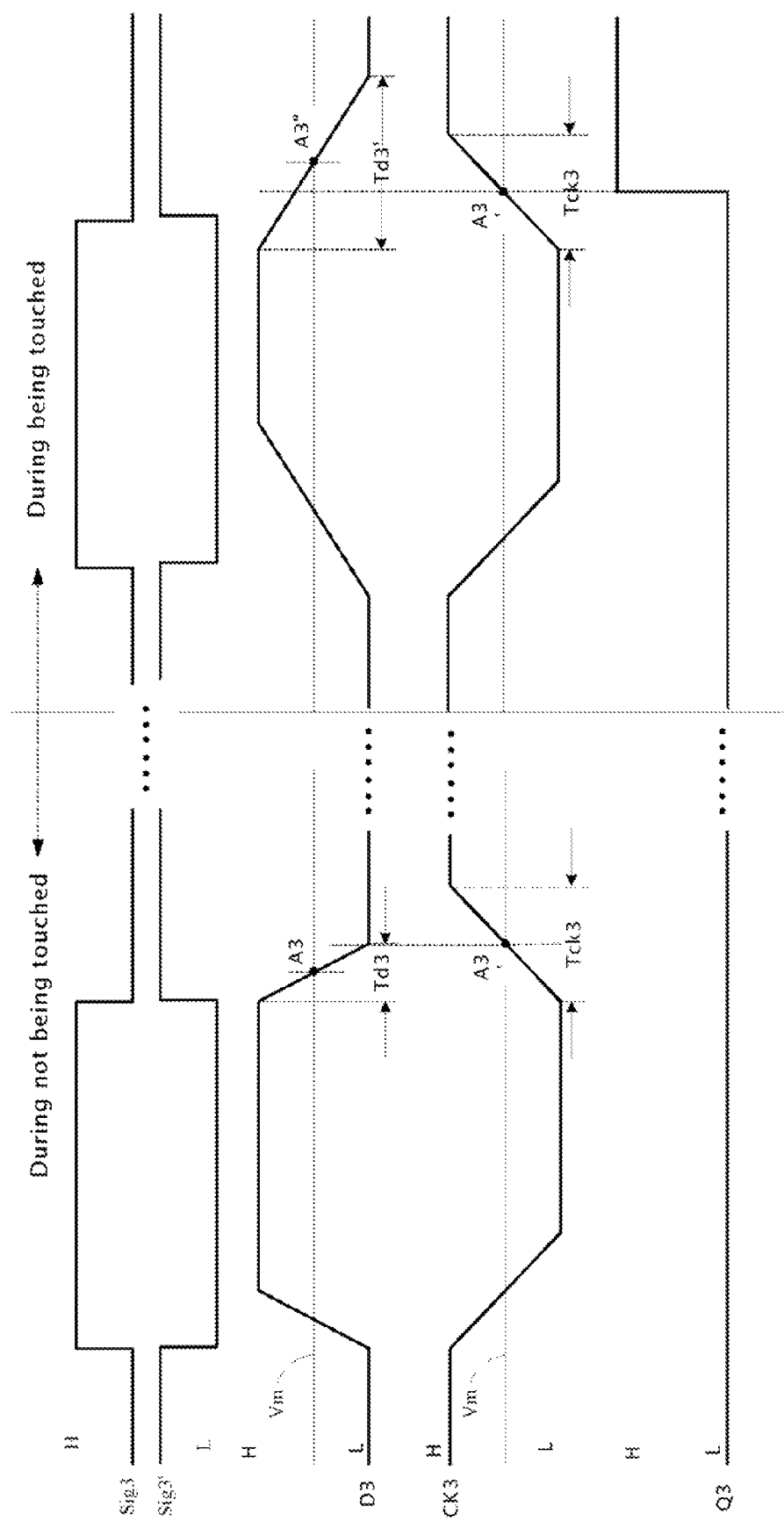
FIG. 6 is a waveform diagram of the input and output signals of the D-type flip-flop 15 when the sensor 13 is touched/not touched correspondingly by the electrical conducting object according to the FIG. 5.

FIG. 6 is a waveform diagram of the input and output signals of the D-type flip-flop 15 when the sensor 13 is touched/not touched correspondingly by the electrical conducting object according to the FIG. 5. Waveform sig3 and sig3' respectively represent the AC signals outputted to the first integration circuit 19 and the second integration circuit by the differential AC signal source 14', waveform D3 represents the D signal, and waveform CK3 represents the CK signal. Intersecting points A3 and A3' between the line Vm with the Waveforms D3 and CK3 respectively represent the transition point and the active trigger point of the D-type flip-flop 15. Td3 and Tck3 respectively indicate the PGT times of the D signals and the CK signals when the sensor 13 is not touched. Td3 is shorter than Tck3 and therefore, the intersecting point A3 comes before the intersecting point A3'. As a result, at intersecting point A3', the D-type flip-flop 15 is triggered to output an L signal indicated in waveform Q3.

When the sensor 13 is touched by the electrical conducting object, the active transition time of the D signals is prolonged to Td3' and longer than Tck3. An intersecting point A3" between the Line Vm and Waveforms D3 representing the transition point of the D signals when the sensor is touched accordingly comes after the intersecting point A3' in timing. As a result, at the intersecting point A3', the D-type flip-flop 15 is triggered to output an H signal indicated in waveform Q3.

Figure 7:
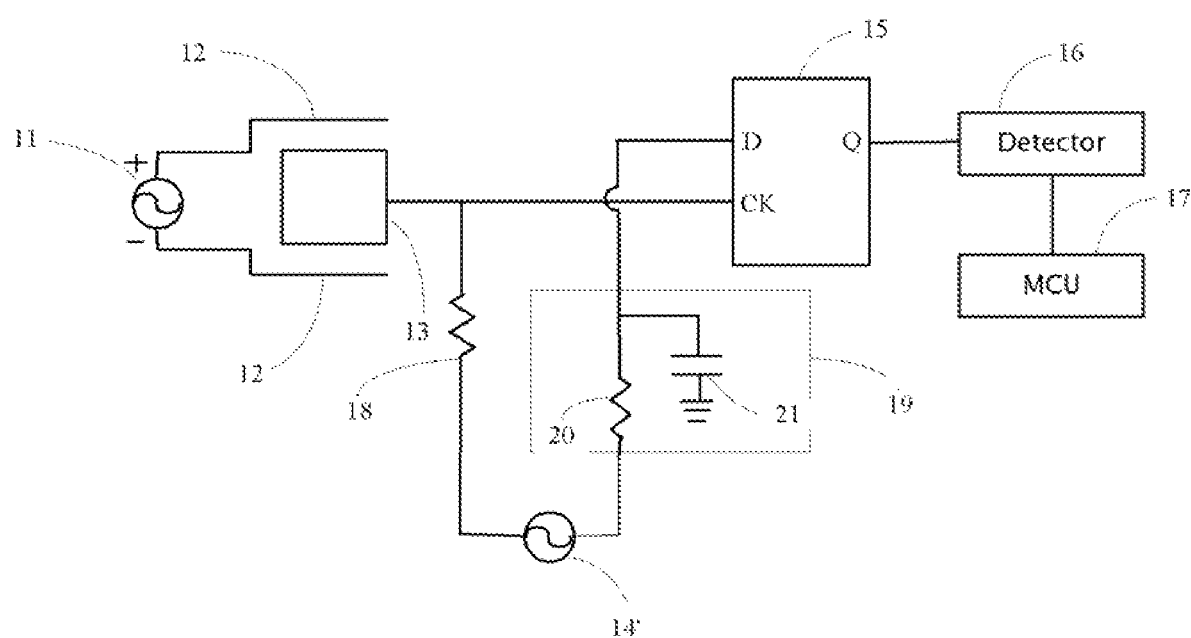
FIG. 7 is an exemplary circuit diagram of a touch sensing apparatus in accordance with a fifth preferred embodiment of the present invention.

FIG. 7 is an exemplary circuit diagram of the touch sensing apparatus in accordance with a fifth preferred embodiment of the present invention. As Compared with FIG. 5, in this embodiment, the first integration circuit 19 is connected to the input D of the D-type flip-flop 15, and the second integration circuit is connected to the input CK of the D-type flip-flop 15. The first integration circuit 19 delays the D signal to be inputted to the input D and second integration circuit delays the CK signals to be inputted to the input CK.

Figure 8:
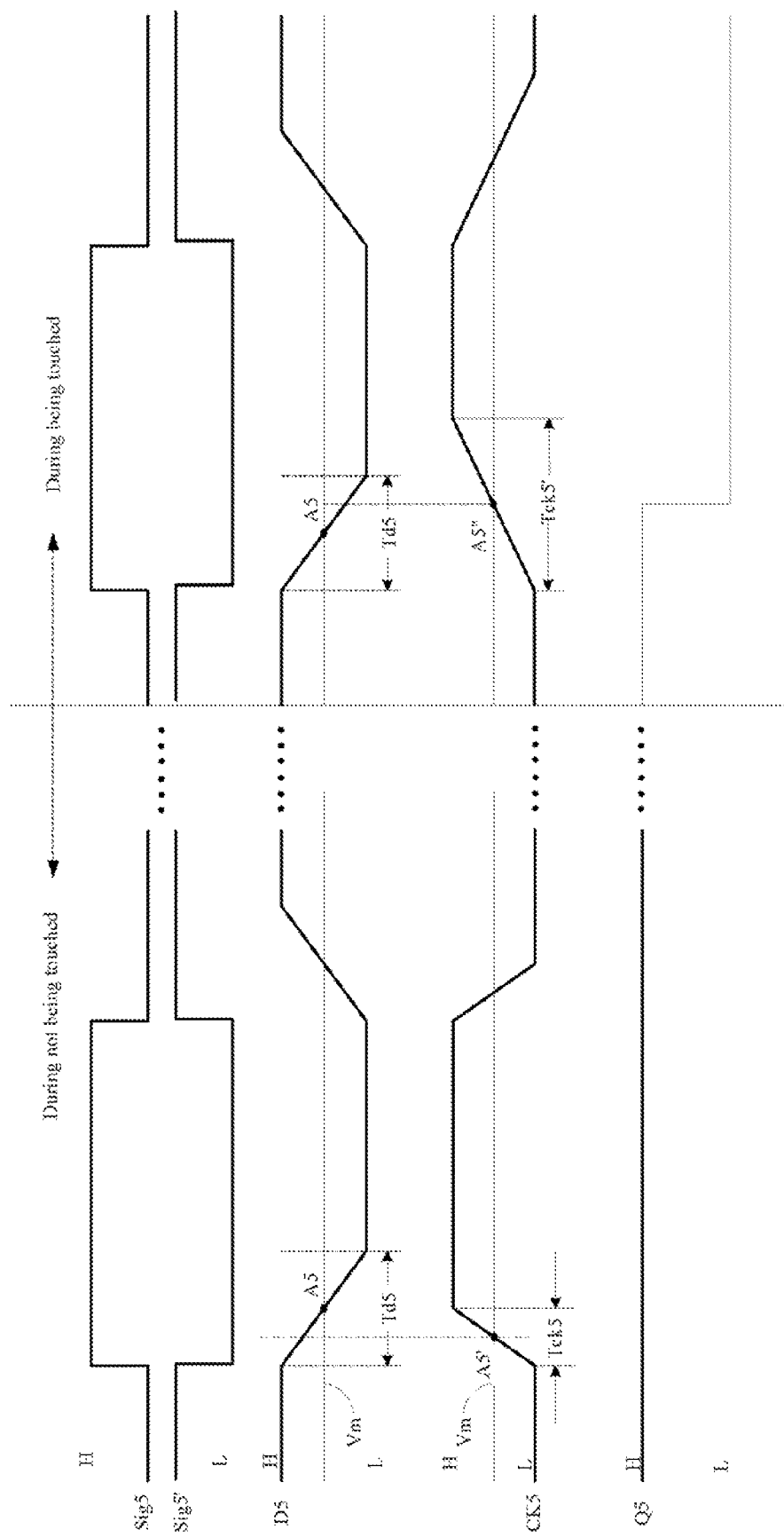
FIG. 8 is a waveform diagram of the input and output signals of the D-type flip-flop 15 when the sensor 13 is touched/not touched correspondingly by the electrical conducting object according to the FIG. 7.

FIG. 8 is a waveform diagram of the input and output signals of the D-type flip-flop 15 when the sensor 13 is touched/not touched correspondingly by the electrical conducting object according to the FIG. 9. Waveform sig5 and sig5' respectively represent the AC signals outputted to the first integration circuit 19 and the second integration circuit by the differential AC signal source 14', waveform D5 represents the D signal, and waveform CK5 represents the CK signal. Intersecting points A5 and A5' between the line Vm with the Waveforms D5 and CK5 respectively represent the transition point and the active trigger point of the D-type flip-flop 15. Td5 and Tck5 respectively indicate the PGT times of the D signals and the CK signals when the sensor 13 is not touched. Td5 is longer than Tck5 and therefore, the intersecting point A5 is reached later in timing than the intersecting point A5'. As a result, at intersecting point A5', the D-type flip-flop 15 is triggered to output an H signal indicated in waveform Q5.

When the sensor 13 is touched by the electrical conducting object, the active transition time of the CK signals is prolonged to TCK5' and longer than Td5. An intersecting point A5" between the Line Vm and Waveforms CK5 representing the active trigger point of the CK signals when the sensor is touched accordingly and comes after the intersecting point A5 in timing. As a result, at the intersecting point A5", the D-type flip-flop 15 is triggered to output an L signal indicated in waveform Q5.

Although the present invention has been specifically described on the basis of a preferred embodiment, the invention is not to be construed as being limited thereto. Various changes or modifications may be made to the embodiment without departing from the scope and spirit of the invention.

What is claimed is:

1. A touch sensing apparatus comprising:
   a flip-flop having a first input, a second input, and an output;
   an alternating current (AC) signal source for supplying AC signals to the first input and the second input of the flip-flop;
   a sensor connected to the first input of the flip-flop and configured for receiving electricity signals from an object that touches the sensor;
   an integration circuit interposed between the second input of the flip-flop and the AC signal source and for delaying the AC signal to be inputted to the second input of the flip-flop;
   a resistor interposed between AC signal source and the first input of the flip-flop; and
   a detector electrically connected to the output of the flip-flop and for detecting a change at the output of the flip-flop;
   wherein the flip-flop outputs a first type output signal at the output thereof when the sensor is not touched;
   the sensor receives electricity signals from the object, and causes a delay of the AC signal to be inputted to the first input of the flip-flop, the delay of the AC signal to be inputted to the first input of the flip-flop further causing the flip-flop to output a second type output signal at the output thereof; and
   the detector detects a change from the first type output signal to the second type output signal at the output of the flip-flop and accordingly identifies a touch on the sensor.

2. The touch sensing apparatus as described in claim 1, wherein the AC signals are generated in phase and at a same frequency, and are inputted to the first input and the second input of the flip-flop simultaneously.

3. The touch sensing apparatus as described in claim 1, wherein the AC signals are generated out of phase and at a same frequency and inputted to the first input and second input of the flip-flop simultaneously.

4. The touch sensing apparatus as described in claim 1, further comprising a microcontroller unit (MCU) for executing a predetermined task after the detector identifies the touch on the sensor.

5. The touch sensing apparatus as described in claim 1, wherein the flip-flop is a D-type flip-flop.

6. The touch sensing apparatus as described in claim 1, further comprising a differential signal source, with a positive signal output and a negative signal output, configured for generating a positive signal and a negative signal.

7. The touch sensing apparatus as described in claim 6, further comprising two conductors respectively connected to the positive signal output and the negative signal output of the differential signal source.

8. The touch sensing apparatus as described in claim 7, wherein the sensor locates between the two conductors and forms two simulated capacitors with the two conductors for offsetting environmental noise.

9. The touch sensing apparatus as described in claim 6, wherein the differential signal source is further provided for providing an alternating magnetic field for the touch sensing apparatus.

* * * * *

UNITED STATES PATENT AND TRADEMARK OFFICE
CERTIFICATE OF CORRECTION

PATENT NO.       : 7,667,693 B2                                                                 Page 1 of 1
APPLICATION NO.  : 11/558421
DATED            : February 23, 2010
INVENTOR(S)      : Chung et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 666 days.

Signed and Sealed this

Seventh Day of December, 2010

David J. Kappos
*Director of the United States Patent and Trademark Office*